United States Patent
Hwang

(10) Patent No.: US 7,586,804 B2
(45) Date of Patent: Sep. 8, 2009

(54) MEMORY CORE, MEMORY DEVICE INCLUDING A MEMORY CORE, AND METHOD THEREOF TESTING A MEMORY CORE

(75) Inventor: Hong-Sun Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 162 days.

(21) Appl. No.: 11/584,565

(22) Filed: Oct. 23, 2006

(65) Prior Publication Data

US 2007/0104006 A1 May 10, 2007

(30) Foreign Application Priority Data

Nov. 8, 2005 (KR) .................. 10-2005-0106247

(51) Int. Cl.
*G11C 7/02* (2006.01)
(52) U.S. Cl. .................. 365/210.1; 365/189.17; 365/201; 365/230.03
(58) Field of Classification Search ............ 365/189.17, 365/201, 210.1, 230.03
See application file for complete search history.

(56) References Cited

U.S. PATENT DOCUMENTS

| 5,214,604 | A | * | 5/1993 | Kato | 365/185.2 |
| 5,383,159 | A | | 1/1995 | Kubota | |
| 6,459,634 | B1 | * | 10/2002 | Sher | 365/201 |
| 6,535,439 | B2 | | 3/2003 | Cowles | |
| 6,650,584 | B2 | * | 11/2003 | Cowles | 365/201 |
| 6,711,050 | B2 | | 3/2004 | Sadakata | |
| 6,876,576 | B2 | * | 4/2005 | Hidaka | 365/171 |
| 7,126,845 | B2 | * | 10/2006 | Hidaka | 365/158 |

FOREIGN PATENT DOCUMENTS

KR    10-439096    6/2004

* cited by examiner

*Primary Examiner*—Hoai V Ho
(74) *Attorney, Agent, or Firm*—Harness, Dickey & Pierce, P.L.C.

(57) ABSTRACT

A memory core and method thereof are provided. The example memory core may include an edge sub-array including a plurality of word lines, a plurality of bit lines, and a plurality of dummy bit lines, a sense amplifier circuit configured to amplify voltages of the plurality of dummy bit lines and a switching circuit configured to transfer at least one input data through the plurality of dummy bit lines, in response to at least one column select signal. The example method may include generating test input data in response to a test enable signal and a write signal, transferring the test input data to a plurality of dummy bit lines, in response to at least one column select signal and amplifying the test input data transferred to the plurality of dummy bit lines.

15 Claims, 6 Drawing Sheets

MEMORY CORE, MEMORY DEVICE INCLUDING A MEMORY CORE, AND METHOD THEREOF TESTING A MEMORY CORE

PRIORITY STATEMENT

This application claims priority under 35 U.S.C. § 119 to Korean Patent Application No. 10-2005-0106247, filed on Nov. 8, 2005, in the Korean Intellectual Property Office (KIPO), the entire contents of which are incorporated herein by reference.

BACKGROUND OF THE INVENTION

1. Field of the Invention

Example embodiments of the present invention relate to a semiconductor memory device and method thereof, and more particularly to a semiconductor memory device including a memory core and method of testing thereof.

2. Description of the Related Art

A conventional semiconductor memory device may be configured to store data. A random-access memory (RAM) device of a volatile type may be configured to function as a primary or main memory device of a computer. A dynamic random-access memory (DRAM) device, which is a type of RAM device, may include a plurality of memory cells. Each memory cell may typically include a transistor and a capacitor. In order to store data, the capacitor may store an electric charge to represent a first logic level (e.g., a higher logic level or logic "1") or a second logic level (e.g., a lower logic level or logic "0"). Because the electric charge stored in the capacitor may be discharged over a period of time, the capacitor of the memory cell may be periodically refreshed.

A memory cell of a conventional DRAM may be electrically coupled to a word line and a bit line. If the transistor of the memory cell is turned on in response to a word line enable signal, data stored in the capacitor may be outputted through the bit line, or data on the bit line may be stored in the capacitor as a form of electric charge.

A conventional semiconductor memory device may have a folded bit-line structure or an open bit-line structure. A memory cell array in a semiconductor memory device having the open bit-line structure may include an edge sub-array having a dummy bit line. The dummy bit line may not be coupled to a sense amplifier, and memory cells coupled to the dummy bit line may not store data.

FIG. 1 is a block diagram illustrating a memory core of a conventional semiconductor memory device including an edge sub-array and a driver.

Referring to FIG. 1, the conventional semiconductor memory device may include an edge sub-array 2, non-edge sub-arrays 4 and 6, sense amplifiers 8, 10, 12, 14, 16 and 18, and a driver 22. The edge sub-array 2, the non-edge sub-arrays 4 and 6, and the sense amplifiers 8, 10, 12, 14, 16 and 18 may collectively constitute a memory core. The non-edge sub-arrays 4 and 6 may include bit lines corresponding to horizontal lines, and word lines corresponding to vertical lines, respectively, and memory cells represented by dark-colored circles may be arranged at intersection points of word lines and bit lines. The edge sub-array 2 may include word lines WL1 through WL4, bit lines BL1 and BL2, and dummy bit lines DBL1 and DBL2, and memory cells represented by dark-colored circles may be arranged at intersection points of word lines and bit lines, and at intersection points of word lines and dummy bit lines. The driver 22 may drive the dummy bit lines DBL1 and DBL2 via data line 20.

Referring to FIG. 1, in a pre-charge operation mode, voltage levels of the dummy bit lines DBL1 and DBL2 may be charged to a ½ VCC via the data line 20. In a test mode, data having the second logic level (e.g., a lower logic level or logic "0", such as a ground voltage level or VSS level) or the first logic level (e.g., a higher logic level or logic "1", such as the VCC level) may be transferred to the dummy bit lines DBL1 and DBL2 via the data line 20.

As shown in FIG. 1, if each dummy bit line is coupled to a single data line, identical data (e.g., set to the first logic level "1" or the second logic level "0") may be transferred to each of the dummy bit lines. Thus, it may be difficult to detect a bridge or defect occurring between a dummy bit line and a normal bit line.

FIG. 2 is a block diagram illustrating another memory core of a conventional semiconductor memory device including an edge sub-array and a driver.

Referring to FIG. 2, a dummy bit line DBL1 may be coupled to a data line 24, and a dummy bit line DBL2 may be coupled to a data line 26. In a pre-charge operation mode, voltage levels of the dummy bit lines DBL1 and DBL2 may be charged to ½ VCC via the data lines 24 and 26. In a test mode, data having logic set to the second logic level (e.g., a lower logic level or logic "0", such as a ground voltage level or VSS level) or the first logic level (e.g., a higher logic level or logic "1", such as the VCC level) may be transferred to the dummy bit line DBL1 via the data line 24, and data having the second logic level (e.g., a lower logic level or logic "0", such as a ground voltage level or VSS level) or the first logic level (e.g., a higher logic level or logic "1", such as the VCC level) may be transferred to the dummy bit line DBL2 via the data line 26. A driver 22 may drive the dummy bit line DBL1 via the data line 24, and the dummy bit line DBL2 via the data line 26.

As shown in FIG. 2, if data is applied to the bit lines via different data lines, respectively, different data may potentially be written to each memory cell coupled to a word line W1. However, a number of data lines may be configured to be the same as a number of memory cells coupled to a single word line, so as to allow data to be freely written into dummy cells. Such a configuration may increase an amount of area required on the conventional semiconductor device such that implementation may become difficult as more memory cells are added.

SUMMARY OF THE INVENTION

An example embodiment of the present invention is directed to a memory core, including an edge sub-array including a plurality of word lines, a plurality of bit lines, and a plurality of dummy bit lines, a sense amplifier circuit configured to amplify voltages of the plurality of dummy bit lines and a switching circuit configured to transfer at least one input data through the plurality of dummy bit lines, in response to at least one column select signal.

Another example embodiment of the present invention is directed to a method of testing a memory core, including generating test input data in response to a test enable signal and a write signal, transferring the test input data to a plurality of dummy bit lines, in response to at least one column select signal and amplifying the test input data transferred to the plurality of dummy bit lines.

Example embodiments of the present invention provides a memory core capable of writing a full pattern of data to memory cells coupled to a dummy bit line included in an edge sub-array of a semiconductor memory device with an open bit-line structure.

Example embodiments of the present invention also provides a semiconductor memory device having a memory core capable of writing a full pattern of data to memory cells coupled to a dummy bit line included in an edge sub-array of a semiconductor memory device with an open bit-line structure.

Example embodiments of the present invention also provides a method of testing an edge sub-array capable of writing a full pattern of data to memory cells coupled to a dummy bit line included in an edge sub-array of a semiconductor memory device with an open bit-line structure.

BRIEF DESCRIPTION OF THE DRAWINGS

The present invention will become more apparent to those of ordinary skill in the art by describing, in detail, example embodiments thereof with reference to the attached drawings, in which like elements are represented by like reference numerals, which are given by way of illustration only and thus do not limit the example embodiments of the present invention.

DETAILED DESCRIPTION OF EXAMPLE EMBODIMENTS OF THE PRESENT INVENTION

Figure 1:
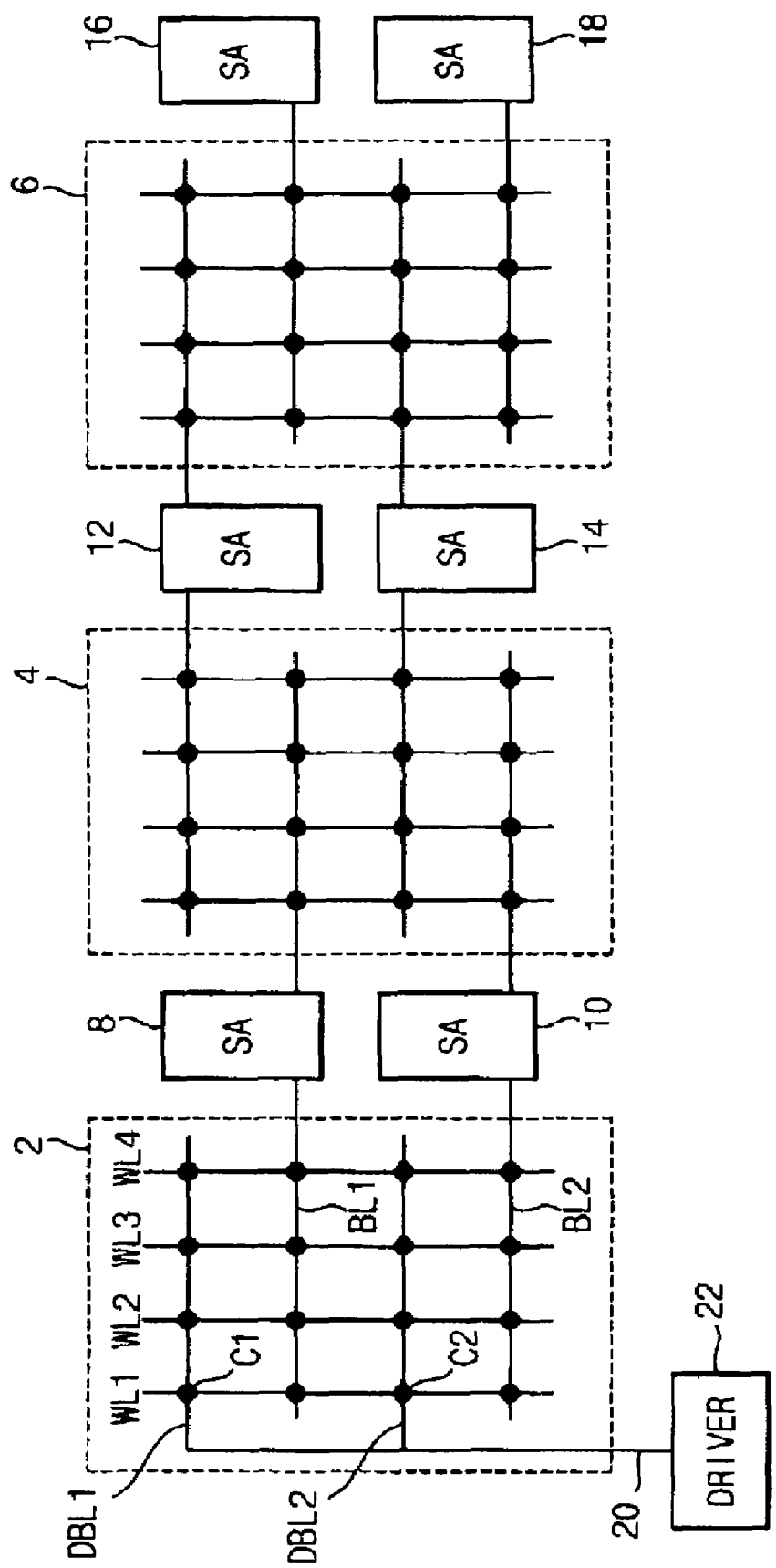
FIG. 1 is a block diagram illustrating a memory core of a conventional semiconductor memory device including an edge sub-array and a driver.
Figure 2:
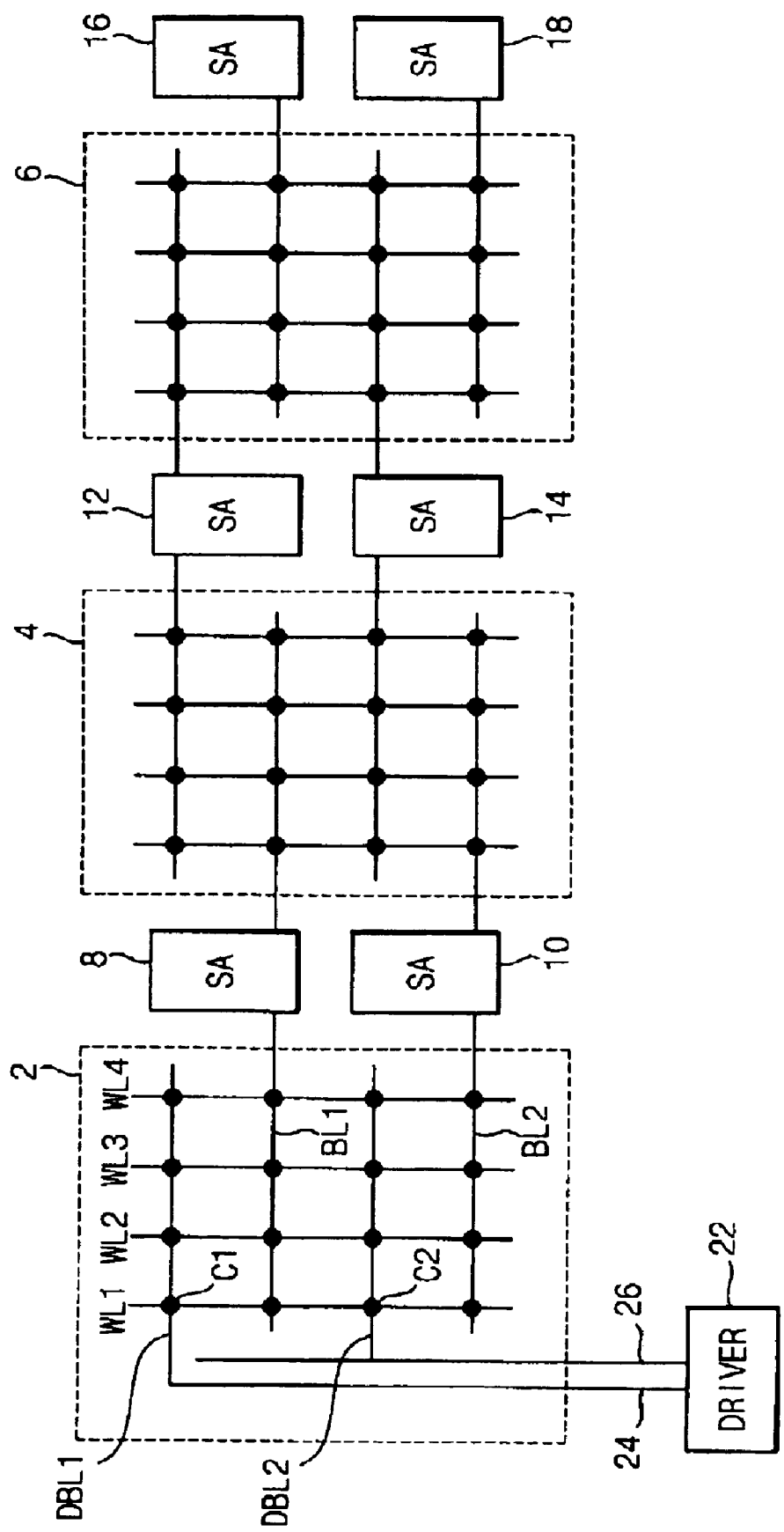
FIG. 2 is a block diagram illustrating another memory core of a conventional semiconductor memory device including an edge sub-array and a driver.

Detailed illustrative example embodiments of the present invention are disclosed herein. However, specific structural and functional details disclosed herein are merely representative for purposes of describing example embodiments of the present invention. This invention may, however, be embodied in many alternate forms and should not be construed as limited to the example embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Figure 3:
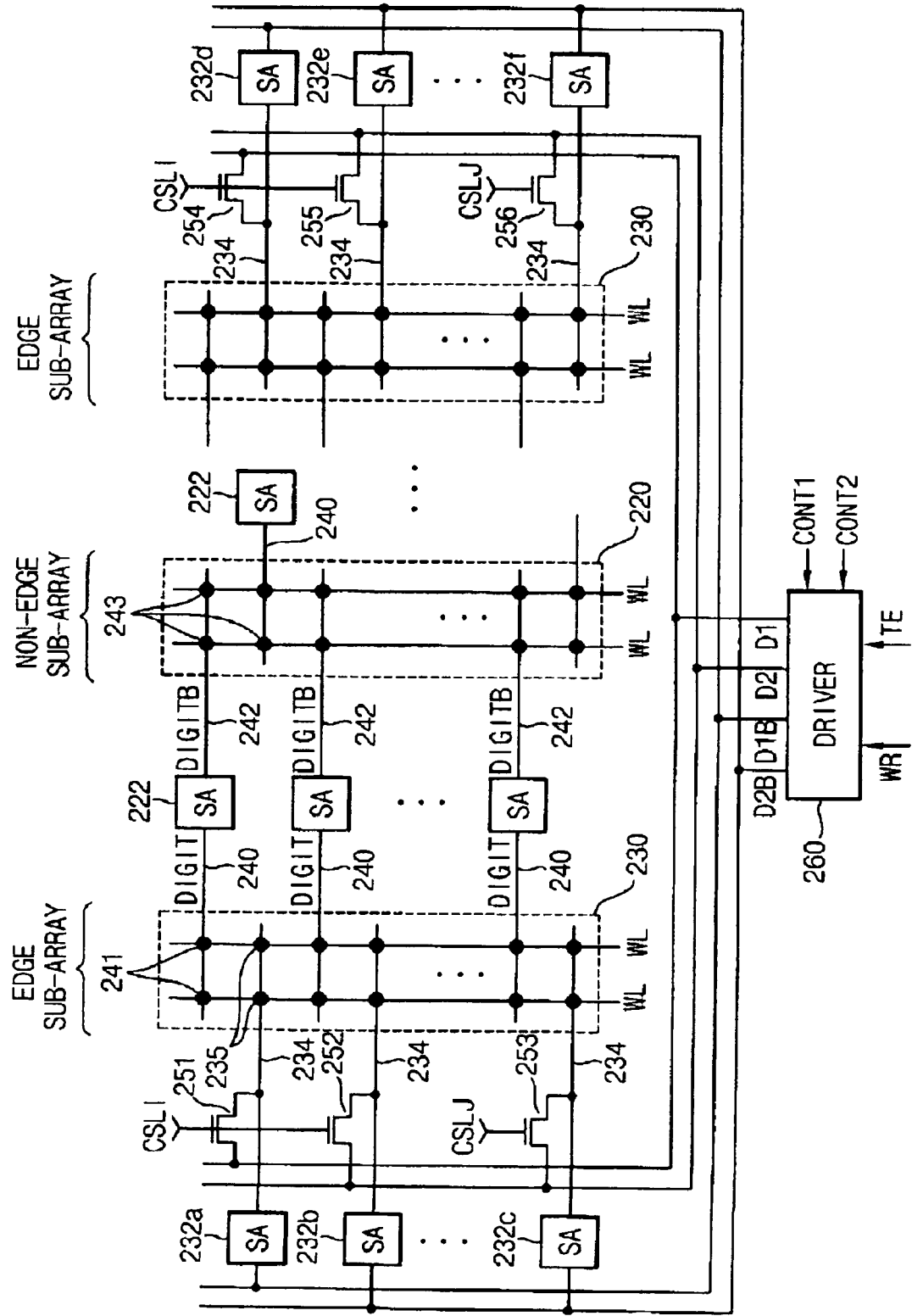
FIG. 3 is a block diagram illustrating a memory core of a semiconductor memory device including an edge sub-array and a driver according to an example embodiment of the present invention.

FIG. 3 is a block diagram illustrating a memory core of a semiconductor memory device including an edge sub-array and a driver according to an example embodiment of the present invention.

In the example embodiment of FIG. 3, the memory core may include an edge sub-array 230, a non-edge sub-array 220, sense amplifiers 222, edge sense amplifiers 232a, 232b, 232c, 232d, 232e and 232f, and N-type metal-oxide semiconductor (NMOS) transistors 251 through 256. The memory core may further include a driver 260, which provides input data D1, D2, D1B and D2B, in response to a test enable signal TE and a write signal WR.

In the example embodiment of FIG. 3, the edge sub-array 230 may include dummy bit lines 234 and bit lines 240 and word lines WL. Memory cells 235 may be arranged at intersection points of the word lines WL and the bit lines 240, and at intersection points of the word lines WL and the dummy bit lines 234. The non-edge sub-array 220 may include bit lines 240 and 242 and word lines WL. Memory cells 243 may be arranged at intersection points of the word lines WL and the bit lines 240 and 242. The bit lines 240 may correspond to the bit lines 242.

Figure 4:
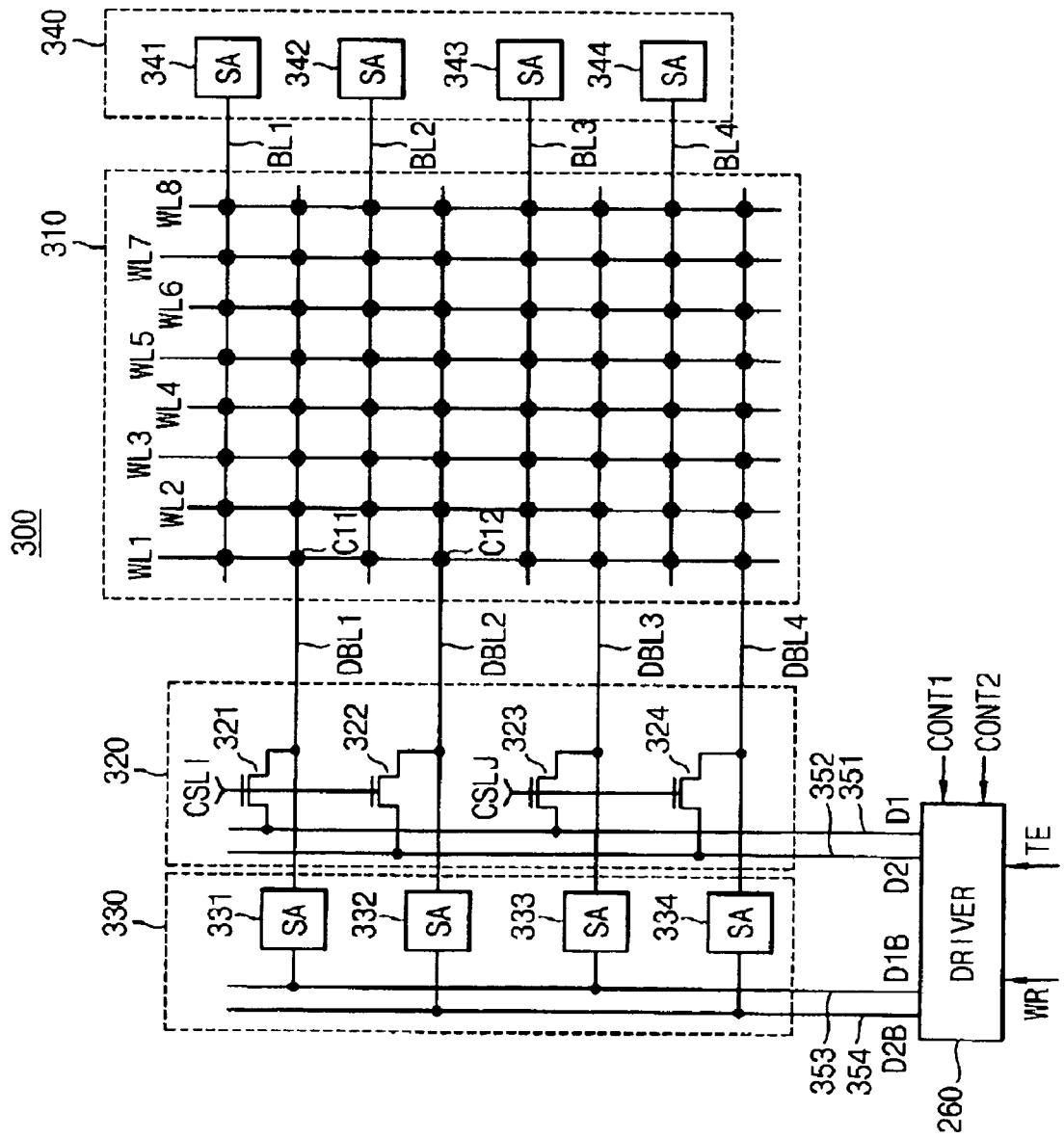
FIG. 4 is a block diagram illustrating a memory core including an edge sub-array having four edge bit lines and four normal bit lines according to another example embodiment of the present invention.

FIG. 4 is a block diagram illustrating a memory core 300 including an edge sub-array having four edge bit lines and four normal bit lines according to another example embodiment of the present invention. In an example, the memory core 300 of FIG. 4 may be representative of the memory core of the semiconductor memory device in the example embodiment of FIG. 3. While the example embodiment of FIG. 4 illustrates particular numbers of edge bit lines and normal bit lines, it will be appreciated that other example embodiments of the present invention may include any number of edge bit lines and/or normal bit lines. Further, it will be appreciated that a non-edge sub-array is not represented in FIG. 4.

In the example embodiment of FIG. 4, the memory core 300 may include an edge sub-array 310, four data lines 351 through 354, a dummy sense amplifier circuit 330, a sense amplifier circuit 340 and a switching circuit 320. The memory core 300 may further include a driver 260 that provides input data D1, D2, D1B and D2B.

In the example embodiment of FIG. 4, the edge sub-array 310 may include eight word lines WL1 through WL8, four non-edge bit lines BL1 through BL4, and four dummy bit lines DBL1 through DBL4. Memory cells may be arranged at intersection points of the word lines WL1 through WL8 and the bit lines BL1 through BL4, and at intersection points of the word lines WL1 through WL8 and the dummy bit lines DBL1 through DBL4.

In the example embodiment of FIG. 4, the edge sub-array 310 may be coupled to the sense amplifier circuit 340 through bit lines BL1 through BL4 and coupled to the dummy sense amplifier circuit 330 through the dummy bit lines DBL1 through DBL4. The sense amplifier circuit 340 may include four sense amplifiers 341 through 344, and the dummy sense amplifier circuit 330 may include four sense amplifiers 331 through 334.

In the example embodiment of FIG. 4, the dummy bit lines DBL1 through DBL4 may be coupled to the switching circuit 320. The switching circuit 320 may include four switches 321 through 324, and the four switches 321 through 324 may include MOS transistors, respectively. A column select signal CSLI may be applied to a control terminal of the switches 321 and 322 and a column select signal CSLJ may be applied to a control terminal of the switches 323 and 324.

In the example embodiment of FIG. 4, the driver 260 may be coupled to the switching circuit 320 through the data lines 351 and 352 and coupled to the dummy sense amplifier circuit 330 through the data lines 353 and 354. The driver 260 may provide input data D1, D2, D1B and D2B in response to a test enable signal TE, a write signal WE, and control signals CONT1 and CONT2. The input data D1 and the input data D1B may be complementary to each other and the input data D2 and the input data D2B may be complementary to each other. Similarly, the data line 351 and the data line 353 may be complementary to each other and the data line 352 and the data line 354 may be complementary to each other.

Figure 5:
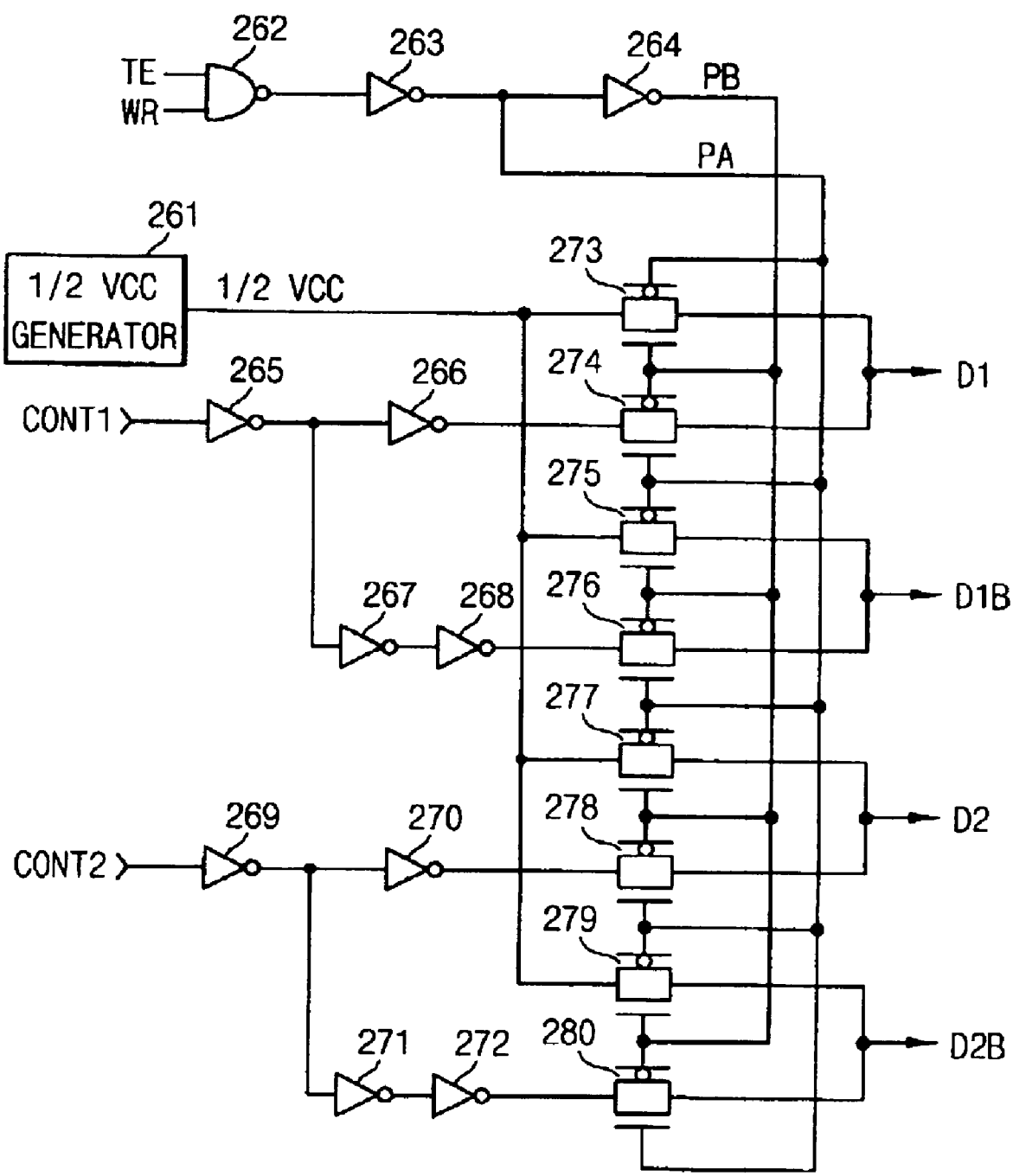
FIG. 5 is a circuit diagram illustrating a driver included in the memory core of the semiconductor memory device in FIGS. 3 and 4 according to another example embodiment of the present invention.

FIG. 5 is a circuit diagram illustrating a driver 260 included in the memory core 300 of the semiconductor memory device in FIGS. 3 and 4 according to another example embodiment of the present invention.

In the example embodiment of FIG. 5, the driver 260 may include a NAND gate 262, inverters 263 through 272, and transmission gates 273 through 280. In an example embodiment, the driver 260 may further include a ½ VCC generator 261 (e.g., generating a voltage equal to about half of a voltage VCC). Example operation of the driver 260 of FIG. 5 will now be described in further detail.

In example operation of the driver 260 of FIG. 5, in a normal operation mode, the driver 260 may provide the input data D1, D2, D1B and D2B having a given voltage level (e.g., ½ VCC). In a test mode, the driver 260 may provide the control signal CONT1 as the input data D1 and an inverted signal, which is inverted from the control signal CONT1, as the input data D1B. In the test mode, the driver 260 may provide the control signal CONT2 as the input data D2 and an inverted signal, which is inverted from the control signal CONT2, as the input data D2B.

In example operation of the driver 260 of FIG. 5, if at least one signal of the test enable signal TE and the write signal WR is disabled, an output signal of the NAND gate 262 may be set to a first logic level (e.g., a higher logic level or logic "1"), an output signal of the inverter 263 may be set to a second logic level (e.g., a lower logic level or logic "0") and an output signal of the inverter 264 may be set to the first logic level. The transmission gates 273, 275, 277 and 279 may be turned on, and the transmission gates 274, 276, 278 and 280 may be turned off. Thus, the given voltage level (e.g., ½ VCC) may be outputted as the input data D1, D2, D1B and D2B.

In example operation of the driver 260 of FIG. 5, if both the test enable signal TE and the write signal are enabled, (e.g., both the test enable signal TE and the write signal WR are set to the first logic level), the output signal of the NAND gate 262 may be set to the second logic level (e.g., a lower logic level or logic "0"), the output signal of the inverter 263 may be set to the first logic level (e.g., a higher logic level or logic "1") and the output signal of the inverter 264 may be set to the second logic level. The transmission gates 273, 275, 277 and 279 may be turned off, and the transmission gates 274, 276, 278 and 280 may be turned on. Thus, the control signal CONT1 may be output as the input data D1, and the inverted signal, which is inverted from the control signal CONT1, may be output as the input data D1B. In addition, the control signal CONT2 may be output as the input data D2, and the inverted signal, which is inverted from the control signal CONT2, may be output as the input data D2B.

Figure 6:
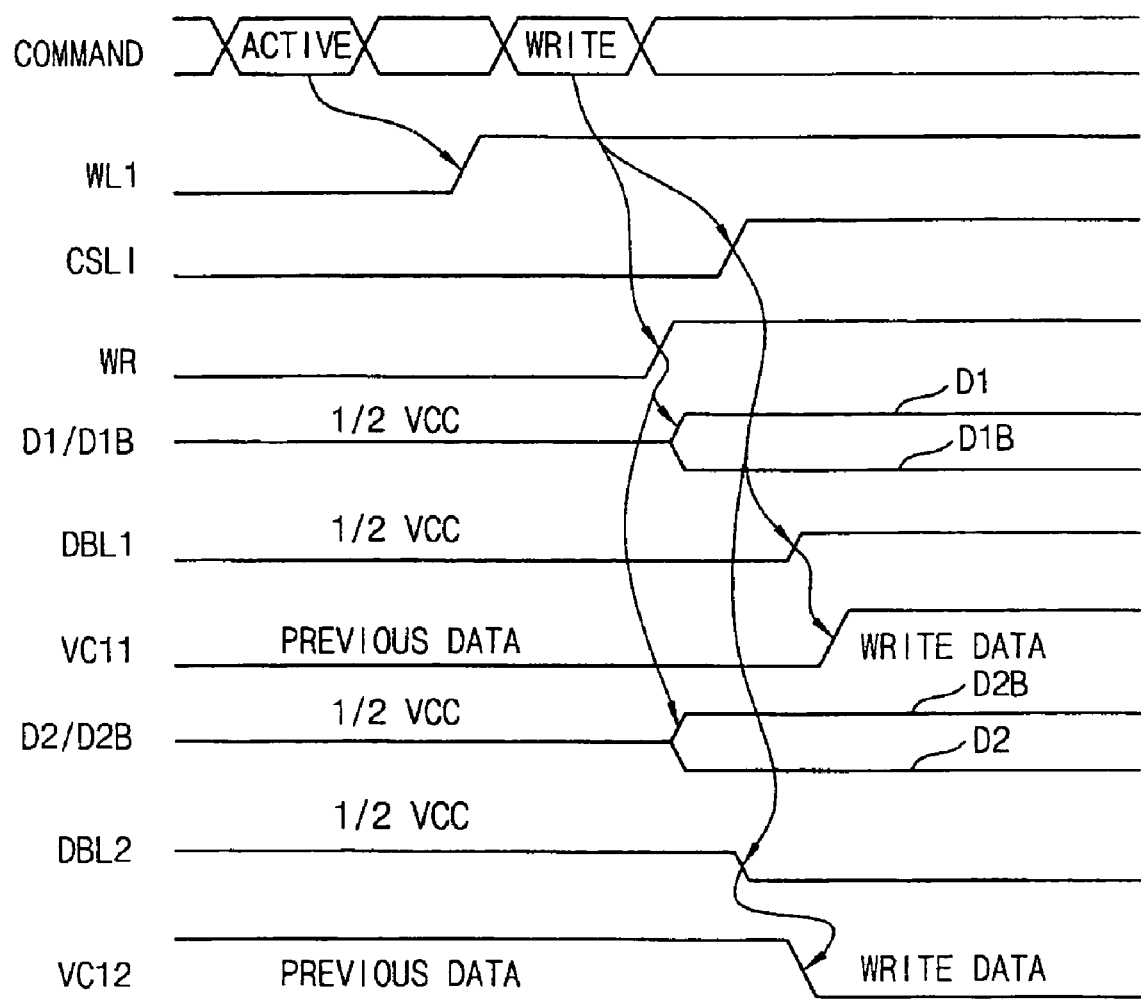
FIG. 6 is a timing diagram of signals during an operation of the memory core 300 of FIGS. 3 and 4 according to another example embodiment of the present invention.

FIG. 6 is a timing diagram of signals during an operation of the memory core 300 of FIGS. 3 and 4 according to another example embodiment of the present invention. Example operation of the memory core 300 of the semiconductor memory will now be described in greater detail with reference to FIGS. 3 through 6.

In example operation of the memory core 300 of FIGS. 3 and 4, with reference to FIGS. 5 and 6, in the normal operation mode, the voltage level of input data D1, D2, D1B and D2B may correspond to a given voltage level (e.g., ½ VCC) and the dummy bit lines DBL1 through DBL4 may be charged to the given voltage level (e.g., ½ VCC) by the input data D1, D2, D1B and D2B.

In example operation of the memory core 300 of FIGS. 3 and 4, with reference to FIGS. 5 and 6, if the control signal CONT1 is set to the first logic level (e.g., a higher logic level or logic "1"), the control signal CONT2 is set to the second logic level (e.g., a lower logic level or logic "0") and the test enable signal TE and the write signal WR are enabled, the driver 260 may provide the input data D1 (e.g., set to the first logic level) and the input data D1B (e.g., set to the second logic level) in response to the control signal CONT1. The driver 260 may provide the input data D2 (e.g., set to the second logic level) and the input data D2B (e.g., set to the first logic level) in response to the control signal CONT2.

In example operation of the memory core 300 of FIGS. 3 and 4, with reference to FIGS. 5 and 6, column select signals CSLI and CSLJ may be generated based on a column address. The non-edge sub-array may transfer data of the memory array to a local I/O line, or alternatively may transfer data of the local I/O line to the memory core 300, in response to the column select signals CSLI and CSLJ.

Example operation of the memory core 300 where the column select signals CSLI and CSLJ are enabled will now be described.

In example operation of the memory core 300 of FIGS. 3 and 4, with reference to FIGS. 5 and 6, if the input data D1 and the input data D2 are each set to the second logic level (e.g., a lower logic level or logic "0"), data set to the second logic level may be transferred to the dummy bit lines DBL1 through DBL4. If the input data D1 and the input data D2 are set to the first logic level (e.g., a higher logic level or logic "1"), data set to the first logic level may be transferred to the dummy bit lines DBL1 through DBL4. If the input data D1 is set to the first logic level and the input data D2 is set to the second logic level, data set to the first logic level may be transferred to the dummy bit lines DBL1 and DBL3, and data set to the second logic level may be transferred to the dummy bit lines DBL2 and DBL4.

Example operation of the memory core 300 where the column select signals CSLI is enabled and the column select signal CLSJ is disabled will now be described.

In example operation of the memory core 300 of FIGS. 3 and 4, with reference to FIGS. 5 and 6, if the input data D1 and the input data D2 are each set to the second logic level (e.g., a lower logic level or logic "0"), data set to the second logic level may be transferred to the dummy bit lines DBL1 and DBL2, and data may not be transferred to the dummy bit lines DBL3 and DBL4. If the input data D1 and the input data D2 are each set to the first logic level (e.g., a higher logic level or logic "1"), data set to the first logic level may be transferred to the dummy bit lines DBL1 and DBL2, and data may not be transferred to the dummy bit lines DBL3 and DBL4. If the input data D1 is set to the first logic level and the input data D2 is set to the second logic level, data set to the first logic level may be transferred to the dummy bit line DBL1, data set to the second logic level may be transferred to the dummy bit line DBL2, and data may not be transferred to the dummy bit lines DBL3 and DBL4. If the input data D1 is set to the second logic level and the input data D2 is set to the first logic level, data set to the second logic level may be transferred to the dummy bit line DBL1, data set to the first logic level may be transferred to the dummy bit line DBL2, and data may not be transferred to the dummy bit lines DBL3 and DBL4.

In example operation of the memory core 300 of FIGS. 3 and 4, with reference to FIGS. 5 and 6, if the column select signal CSLI is disabled and the column select signal CLSJ is enabled, the memory core 300 may operate in a manner "opposite" to a condition where the column select signal CSLI is enabled and the column select signal CLSJ is disabled, as will now be described in greater detail.

Accordingly, in example operation of the memory core 300 of FIGS. 3 and 4, with reference to FIGS. 5 and 6, if the input data D1 and the input data D2 are each set to the second logic level (e.g., a lower logic level or logic "0"), data set to the second logic level may be transferred to the dummy bit lines DBL3 and DBL4, and data may not be transferred to the dummy bit lines DBL1 and DBL2. If the input data D1 and the input data D2 are each set to the first logic level (e.g., a higher logic level or logic "1"), data set to the first logic level may be transferred to the dummy bit lines DBL3 and DBL4, and data may not be transferred to the dummy bit lines DBL1 and DBL2. If the input data D1 is set to the first logic level and the input data D2 is set to the second logic level, data set to the first logic level may be transferred to the dummy bit line DBL3, data set to the second logic level may be transferred to the dummy bit line DBL4, and data may not be transferred to the dummy bit lines DBL1 and DBL2. If the input data D1 is set to the second logic level and the input data D2 is set to the first logic level, data set to the second logic level may be transferred to the dummy bit line DBL3, data set to the first logic level may be transferred to the dummy bit line DBL4, and data may not be transferred to the dummy bit lines DBL1 and DBL2.

In example operation of the memory core 300 of FIGS. 3 and 4, with reference to FIGS. 5 and 6, because the switches 321 through 324 may include respective NMOS transistors, a voltage that corresponds to a data line voltage minus a threshold voltage Vth of the NMOS transistor may be transferred to the dummy bit lines DBL1 through DBL4. For example, if the input data D1 is set to the first logic level (e.g., a higher logic level or logic "1"), the voltage level of the data line 351 may correspond to 3 V and the voltage level of the Vth may correspond to 1 V. Thus, in this example, the voltage level of the dummy bit lines DBL1 through DBL4 may be charged to 2 V (e.g., 3 V minus 1 V) if the column select signals CSLI and CSLJ are enabled.

In example operation of the memory core 300 of FIGS. 3 and 4, with reference to FIGS. 5 and 6, the dummy sense amplifier circuit 330 may amplify a voltage of the dummy bit lines DBL1 through DBL4 such that the voltage level of the dummy bit lines DBL1 through DBL4 may correspond to a "full" VCC level (e.g., the first logic level) or a "full" VSS level (e.g., a ground voltage level, or the second logic level). In an example, the sense amplifier 331 may amplify a voltage of the dummy bit line DBL1, the sense amplifier 332 may amplify a voltage of the dummy bit line 14. DBL2, the sense amplifier 333 may amplify a voltage of the dummy bit line DBL3, and the sense amplifier 334 may amplify a voltage of the dummy bit line DBL4.

As described above, the memory core 300 of FIGS. 3 and 4 may be capable of writing a full pattern of data to memory cells by the dummy bit lines. Therefore, it will be appreciated that a bridge or a defect occurring in the edge sub-array of the memory core may be detected via a testing process.

The example embodiment of FIG. 6 will now be described in greater detail. The timing diagram of FIG. 6 may illustrate a condition where the input data D1 is set to the first logic level (e.g., a higher logic level or logic "1") and the input data D2 is set to the second logic level (e.g., a lower logic level or logic "0").

In the example embodiment of FIG. 6, WL1 may be indicate a signal of the word line WL1, CSLI may be indicate a column select signal input to the control terminal of the switches 251 and 252, WR may indicate a write signal, D1/D1B and D2/D2B may indicate input data, DBL1 and DBL2 may indicate voltage levels of the dummy bit lines DBL1 and DBL2, VC11 may indicate a voltage level of the memory cell coupled to the DBL1, and VC12 may indicate a voltage level of the memory cell coupled to the DBL2. The test enable signal TE has been omitted in FIG. 6.

In the example embodiments of FIGS. 4 and 6, the word line WL1 may be activated by an active command ACTIVE and the column select signal CSLI and the write signal WR may be enabled by a write command WRITE. If the write signal WR is enabled, the voltage level of the input data D1 may transition from a first voltage level (e.g. ½ VCC) to a second voltage level (e.g., VCC), the voltage level of the input data D1B may transition from the first voltage level (e.g., ½ VCC) to a third voltage level (e.g., a ground voltage level or VSS). The voltage of dummy bit line DBL1 may transition from the first voltage level (e.g. ½ VCC) to the second voltage level (e.g., VCC), and VC11 may transition from previous data (e.g., the first logic level, the second logic level, etc.) to data set to the first logic level (e.g., a higher logic level or logic "1"), in response to the column select signal CSLI. If the write signal WR is enabled, the voltage level of the input data D2 may transition from the first voltage level (e.g., ½ VCC) to the third voltage level (e.g., a ground voltage level or VSS), and the voltage level of the input data D2B may transition from the first voltage level (e.g., ½ VCC) to the second voltage level (e.g., VCC). The voltage level of the dummy bit line DBL2 may transition from the first voltage level (e.g., ½ VCC) to the third voltage level (e.g., a ground voltage level or VSS), and the voltage level of VC12 may transition from previous data (e.g., set to the first logic level, the second logic level, etc.) to data set to the second logic level (e.g., a lower logic level or logic "0"), in response to the column select signal CSLI.

In another example embodiment of the present invention, a semiconductor memory device including a memory core may be capable of writing a full pattern of data to memory cells coupled to a dummy bit line included in an edge sub-array of the semiconductor memory device with an open bit-line structure, thereby increasing a probability of detecting a defect of the edge sub-array.

Example embodiments of the present invention being thus described, it will be obvious that the same may be varied in many ways. For example, while above-described example embodiments of the present invention refer to particular voltage levels, such the first voltage level (e.g., ½ VCC), the second voltage level (e.g., VCC) and the third voltage level (e.g., a ground voltage level or VSS), it is understood that such example voltage levels are given for example purposes only, and other example embodiments may be directed to electronic devices configured to operate in a manner similar to that which is described above, but with other voltages. Also, the relationships of the first, second and third voltage levels need not be that which is described in the above example embodiments. For example, the first voltage level need not be exactly half of VCC in other example embodiments, but rather may correspond to any voltage level between VSS and VCC, or even a voltage outside the range of VCC or VSS.

Likewise, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, the memory core 300 illustrated in FIGS. 3 and 4 is described, and illustrated, as including particular numbers of elements. However, it will be understood that such an illustration and description is given for the purposes of explanation only, and that other example embodiments may include different numbers of elements. For example, higher capacity semiconductor memory devices may be configured to include additional memory cells as compared to the example embodiments of FIGS. 3 and 4.

Such variations are not to be regarded as a departure from the spirit and scope of example embodiments of the present invention, and all such modifications as would be obvious to one skilled in the art are intended to be included within the scope of the following claims.

What is claimed is:

1. A memory core, comprising:
   an edge sub-array including a plurality of word lines, a plurality of bit lines, and a plurality of dummy bit lines;
   a sense amplifier circuit configured to amplify voltages of the plurality of dummy bit lines;
   a switching circuit configured to transfer at least one input data through the plurality of dummy bit lines, in response to at least one column select signal; and
   a driver configured to provide the at least one input data, in response to a test enable signal and a write signal;
   wherein the driver includes a plurality of transmission gates providing a given voltage level, a first control signal, or a second control signal, in response to the test enable signal and the write signal.

2. The memory core of claim 1, wherein the switching circuit includes a plurality of switches configured to operate in response to the at least one column select signal.

3. The memory core of claim 1, wherein the given voltage level is equal to half of a voltage corresponding to a high logic level.

4. The memory core of claim 1, wherein the driver provides the given voltage level among the at least one input data in a normal operation mode, and provides the first control signal and the second control signal among the at least one input data in a test mode.

5. The memory core of claim 1, wherein the driver provides the first control signal and the second control signal among the at least one input data if the test enable signal and the write signal are enabled.

6. The memory core of claim 5, wherein the driver comprises:
   an AND gate configured to perform an AND operation with respect to the test enable signal and the write signal, to generate a first transmit control signal;
   a first inverter configured to invert the first transmit control signal, to generate a second transmit control signal;
   a second inverter configured to invert the first control signal;
   a third inverter configured to invert the second control signal;
   a first transmission gate configured to include a first control terminal that receives the first transmit control signal, and a second control terminal that receives the second transmit control signal, to output the given voltage level as the first input data, in response to the first control signal and the second control signal;
   a second transmission gate configured to include a first control terminal coupled to the second control terminal of the first transmission gate and that receives the second transmit control signal, and a second control terminal coupled to the first control terminal of the first transmission gate and that receives the first transmit control signal, to output the first control signal as the first input data, in response to the first control signal and the second control signal;
   a third transmission gate configured to include a first control terminal coupled to the second control terminal of the second transmission gate and that receives the first transmit control signal, and a second control terminal coupled to the first control terminal of the first transmission gate and that receives the second transmit control signal, to output the given voltage level as a first inverted input data, in response to the first control signal and the second control signal;
   a fourth transmission gate configured to include a first control terminal coupled to the second control terminal of the third transmission gate and that receives the second transmit control signal, and a second control terminal coupled to the first control terminal of the third transmission gate and that receives the first transmit control signal, to output the output signal of the second inverter as the first inverted input data, in response to the first control signal and the second control signal;
   a fifth transmission gate configured to include a first control terminal coupled to the second control terminal of the fourth transmission gate and that receives the first transmit control signal, and a second control terminal coupled to the first control terminal of the fourth transmission gate and that receives the second transmit control signal, to output the given voltage level as the second input data, in response to the first control signal and the second control signal;

a sixth transmission gate configured to include a first control terminal coupled to the second control terminal of the fifth transmission gate and that receives the second transmit control signal, and a second control terminal coupled to the first control terminal of the fifth transmission gate and that receives the first transmit control signal, to output the second control signal as the second input data, in response to the first control signal and the second control signal;

a seventh transmission gate configured to include a first control terminal coupled to the second control terminal of the sixth transmission gate and that receives the first transmit control signal, and a second control terminal coupled to the first control terminal of the sixth transmission gate and that receives the second transmit control signal, to output the given voltage level as a second inverted input data, in response to the first control signal and the second control signal; and an eighth transmission gate configured to include a first control terminal coupled to the second control terminal of the seventh transmission gate and that receives the second transmit control signal, and a second control terminal coupled to the first control terminal of the seventh transmission gate and that receives the first transmit control signal, to output the output signal of the third inverter as the second inverted input data, in response to the first control signal and the second control signal.

7. The memory core of claim 6, wherein the driver further comprises:

a ½ VCC generator configured to generate the given voltage level, the given voltage level being equal to ½ of a voltage level VCC, the voltage level VCC corresponding to a voltage level of a high logic level.

8. The memory core of claim 1, further comprising:

a plurality of data lines configured to receive the at least one input data;

wherein the sense amplifier circuit includes a plurality of sense amplifiers respectively coupled to the plurality of dummy bit lines, and wherein the switching circuit includes a plurality of switches respectively coupled to the plurality of dummy bit lines, and further coupled to one of the plurality of data lines.

9. The memory core of claim 1, wherein the edge sub-array includes memory cells that are arranged at intersection points of the word lines and the bit lines, and at intersection points of the word lines and the dummy bit lines.

10. The memory core of claim 8, wherein the plurality of switches includes at least one switching group, with each switching group including at least one of the plurality of switches configured to switch in response to one or more of the at least one column select signal.

11. The memory core of claim 8, wherein the given voltage level is equal to half of a voltage corresponding to a high logic level.

12. The memory core of claim 8, wherein the driver provides the given voltage level among the at least one input data in a normal operation mode, and provides the first control signal and the second control signal among the at least one input data in a test mode.

13. The memory core of claim 8, wherein the driver provides the first control signal and the second control signal among the at least one input data if the test enable signal and the write signal are enabled.

14. A semiconductor memory device including the memory core of claim 1.

15. A method of testing the memory core of claim 1, comprising:

generating the at least one input data; and transferring the at least one input data through the plurality of dummy bit lines, in response to the at least one column select signal.

* * * * *